US012046585B2

(12) United States Patent
Döker (10) Patent No.: US 12,046,585 B2
(45) Date of Patent: Jul. 23, 2024

(54) ASSEMBLY HAVING A PLURALITY OF LEDS AND VIDEO BOARD

(71) Applicant: B1 LED Videoboard UG, Münster (DE)

(72) Inventor: Werner Döker, Münster (DE)

(73) Assignee: Screen Experts GmbH, Muenster (DE)

( * ) Notice: Subject to any disclaimer, the term of this patent is extended or adjusted under 35 U.S.C. 154(b) by 431 days.

(21) Appl. No.: 16/317,130

(22) PCT Filed: Jul. 10, 2017

(86) PCT No.: PCT/EP2017/067259
§ 371 (c)(1),
(2) Date: Feb. 7, 2019

(87) PCT Pub. No.: WO2018/011137
PCT Pub. Date: Jan. 18, 2018

(65) Prior Publication Data
US 2019/0229099 A1     Jul. 25, 2019

(30) Foreign Application Priority Data

Jul. 11, 2016  (EP) .................................... 16178827

(51) Int. Cl.
  *H01L 25/075*  (2006.01)
  *G09F 9/33*    (2006.01)
  *H05K 5/00*    (2006.01)

(52) U.S. Cl.
  CPC ............ *H01L 25/0753* (2013.01); *G09F 9/33* (2013.01); *H05K 5/0017* (2013.01); *H01L 2924/181* (2013.01); *H05K 2201/10969* (2013.01)

(58) Field of Classification Search
  CPC ....... H01L 25/0753; H01L 2924/09701; H01L 2224/8592; H01L 2924/181;
  (Continued)

(56) References Cited

U.S. PATENT DOCUMENTS 4,241,277 A     12/1980  Hintze et al.
4,271,408 A  *  6/1981   Teshima ................. G09F 13/22
                                                              345/83
(Continued)

FOREIGN PATENT DOCUMENTS

CN     2225081 Y       4/1996
CN     1996592 A   *   7/2007   ......... H01L 25/0657
(Continued)

OTHER PUBLICATIONS

European Patent Office, Application No. 16178827.8, Office Action, Jan. 8, 2019, 5 pages (English language translation not available).
(Continued)

*Primary Examiner* — David Chen
(74) *Attorney, Agent, or Firm* — LaBatt, LLC (57) ABSTRACT

The invention relates to an assembly, on which a plurality of light-emitting diodes are arranged and spaced apart by intermediate Spaces. According to the invention, the assembly is developed further by the fact that the intermediate Spaces between the light-emitting diodes comprise a heat-resistant or fire-resistant or non-combustible material and/or that a front panel comprising a heat-resistant or fire-resistant or non-combustible material is provided. The invention also relates to a video board.

21 Claims, 4 Drawing Sheets

(58) Field of Classification Search
CPC ......... H01L 2224/16225; H01L 25/167; H01L 27/3293; H01L 2924/12041; H01L 33/50; H01L 33/502; H01L 33/64; G09F 9/33; H05K 2201/10106; H05K 1/189; H05K 5/0017; H05K 1/028; H05K 2201/10969; H05K 3/284
USPC .................. 257/88, 98, 99, E23.001, E25.02
See application file for complete search history.

(56) References Cited

U.S. PATENT DOCUMENTS

| | | | |
|---|---|---|---|
| 4,713,579 A | 12/1987 | Miura | |
| 4,742,432 A * | 5/1988 | Thillays | G09F 9/33 |
| | | | 257/E25.02 |
| 8,367,436 B2 | 2/2013 | Kwack et al. | |
| 9,404,647 B2 * | 8/2016 | Duckworth | F21V 25/12 |
| 2004/0264206 A1 * | 12/2004 | Miller | G09F 27/008 |
| | | | 362/487 |
| 2008/0203412 A1 * | 8/2008 | Shyu | H01L 33/58 |
| | | | 257/98 |
| 2009/0296387 A1 * | 12/2009 | Reisenauer | F21V 29/89 |
| | | | 362/235 |
| 2010/0164346 A1 * | 7/2010 | Li | F21V 7/06 |
| | | | 313/46 |
| 2011/0149571 A1 * | 6/2011 | Lin | H01L 25/0753 |
| | | | 362/249.02 |
| 2013/0285077 A1 * | 10/2013 | Kojima | H01L 33/486 |
| | | | 257/88 |
| 2014/0153241 A1 * | 6/2014 | Templeton | G09F 9/33 |
| | | | 362/249.02 |
| 2015/0330610 A1 * | 11/2015 | Song | F21V 21/145 |
| | | | 362/6 |
| 2016/0252231 A1 * | 9/2016 | Fujikawa | F21V 19/005 |
| | | | 362/235 |
| 2017/0294426 A1 * | 10/2017 | Uchida | G01S 17/04 |

FOREIGN PATENT DOCUMENTS

| | | | |
|---|---|---|---|
| CN | 201561403 U | | 8/2010 |
| CN | 102504734 A | * | 6/2012 |
| CN | 104556965 A | * | 4/2015 |
| EP | 0182254 A2 | | 5/1986 |
| EP | 3270369 B1 | | 5/2020 |
| JP | 2009152321 A | * | 7/2009 |
| KR | 20080072154 A | | 8/2008 |
| KR | 1020110130928 A | | 12/2011 |
| WO | 8001860 A1 | | 9/1980 |

OTHER PUBLICATIONS

Pantoja Conde, International Search Report for International Application No. PCT/EP2017/067259, Aug. 28, 2017.

KR Application No. 1020197003992, Office Action, Feb. 11, 2019, received Jun. 4, 2020, 9 pages, English translation.

* cited by examiner

ASSEMBLY HAVING A PLURALITY OF LEDS AND VIDEO BOARD

The present invention is concerned in a first aspect with an assembly with the features according to the preamble of claim 1. Such assemblies have a plurality of light emitting diodes which are arranged on the assembly spaced by interspaces. They are being used versatilely, particularly as so-called LED-illuminants, and belong to energy-saving illuminants. Furthermore, the invention relates to a video board with at least one assembly according to the invention.

It is one object of the invention to improve the above-mentioned generic products.

This object is achieved according to a first aspect of the invention by a product, namely by an assembly having the features of claim 1.

According to the invention, the assembly as mentioned above is developed further in that the interspaces between the light emitting diodes comprise a heat-resistant or fire-proof or non-flammable material and/or that a front panel is present which comprises a heat-resistant or fire-proof or non-flammable material.

The invention provides a video board optimized with regard to fire protection and safety technology.

Particularly good properties with regard to heat and fire resistance are achieved if the interspaces between the light emitting diodes are completely filled with the heat-resistant, fire-proof or non-inflammable material and/or if a front panel is present which is made of the heat-resistant, fire-proof or non-flammable material.

Preferably, the interspaces between the light emitting diodes of the assembly comprise an inorganic, ceramic or metallic material, particularly preferably glass, fiberglass or aluminum or another material of the fire protection class A1.

The video board according to the invention can preferably comprise a housing, energy supply means and control devices for the at least one assembly. It can also be advantageous to arrange a plurality of video boards according to the invention adjacent to each other, in particular in the form of a matrix. In this regard, an arrangement in the form of tiles is particularly preferred such that a closed surface is formed by the assemblies of the individual video boards. For example, such an arrangement can be arranged at a wall of a housing and can serve for the reproduction of information, e.g. advertisements. For this, a control device for controlling the plurality of video boards can be present.

In the context of the description of the present invention and of the definition of the subject matter of the patent claims an inorganic material shall be understood to be a material that does not contain carbon, at least not in a stoichiometric concentration. Inorganic materials in this sense include in particular metals and its alloys and its non-carbon-containing compounds, in particular metal oxides and metal halides but also compounds and mixtures containing silicon like, e.g., glasses or other frozen inorganic liquids, in particular silicate glasses. Metals or metal alloys like steel doped with carbon (not in a stoichiometric concentration) also belong to the inorganic materials in this sense.

According to preferred embodiments of the invention, the light emitting diodes are arranged on a first surface. More preferably, the light emitting diodes are arranged on this first surface in the form of a matrix.

The categorization of materials, in particular of building materials, according to their inflammability has taken place in Germany according to DIN 4102 part 1 in two classes of building materials (sometimes also termed inflammability classes or—in technical terms not entirely correct—as fire classes) (see also https://de.wikipedia.org/wiki/Brandverhalten#Brandverhalten_von_Baustoffen).

Class A—non-flammable building materials

Class A1—without flammable components, proof according to DIN 4102-1 is required if not named in DIN 4102-4 (e.g. sand, gravel, pumice, cement, lime, foam glass, mortar, (reinforced) concrete, stone, building panels made of from mineral components, pure mineral fibers, bricks, glass, iron and steel but no metal dust)

Class A2—containing small amounts of flammable components, proof according to DIN 4102-1 is required, if not named in DIN 4102-4 (e.g. sandwich type plaster boards according to DIN 18180 and with a closed surface).

Class B—flammable building materials

Class B1—flame retardant (e.g. wood wool lightweight panels according to DIN, sandwich type plaster boards according to DIN 18180 and with a perforated surface, rigid foam thermal insulation panels with flame retardant additives, synthetic resin plaster if made from mineral, if made from mineral materials and applied to a massive or mineral underground, miscellaneous floor covers like oak flooring, mastic asphalt or rolled asphalt-screed)

Class B2—normal flammability (e.g. wood larger than certain dimensions, sandwich type plaster compound boards, rigid foam thermal insulation panels without flame retardant additives, miscellaneous plastics and panels or fittings made thereof, electrical lines and miscellaneous bitumen sheets as well as roof and sealing membranes. With the last three it possibly has to be proven by tests that they do not fall off burning.

Class B3—high flammability (everything that cannot be grouped into B1 or B2).

Up and until building material class B1 building materials are deemed self-distinguishing. With building material class B2 and higher the fire is self-sustaining even if the cause of the fire stops.

Important is also the European Standard EN 13501-1. A table in which the classifications of German Standard DIN 4102 part 1 and the European Standard EN 13501-1 are compared can be found at: https://de.wikipedia.org/wiki/Brandverhalten.

According to further preferred embodiments of the invention the heat-resistant or fire-proof or non-flammable material is arranged on the first surface in the form of a second surface. The second surface, insofar as it is not transparent or not sufficiently transparent for the light emitted by the light emitting diodes, comprises a plurality of recesses which are arranged in the second surface such that the light emitted by the light emitting diodes, at least in a direction of the surface normal, is not inhibited from being irradiated.

A material which is not transparent or not sufficiently transparent for the light emitted by the light emitting diodes (LEDs) shall be understood in this context to be any material with an absorption characteristics, described e.g. by an (optical) extinction coefficient, in the relevant optical spectral region that would disturb or exclude an intended use defined by the respective application of the light emitted by the light emitting diodes (LEDs).

According to this definition, a material which is transparent or at least sufficiently transparent for the light emitted by the light emitting diodes shall be understood to be a material with an absorption characteristics, described e.g. by an (optical) extinction coefficient, in the relevant optical spectral region that would not disturb or, in any case, would not exclude an intended use defined by the respective application of the light emitted by the light emitting diodes (LEDs).

According to further preferred embodiments of the invention, the recesses are filled with a heat-resistant or fire-proof or non-inflammable material which is transparent or at least sufficiently transparent for the light emitted by the light emitting diodes.

According to further preferred embodiments of the invention objects made of a heat-resistant or fire-proof or non-inflammable material, which preferably comprises glass platelets, are, in each case, fixed on, and preferably glued to, the light emitting diodes, particularly on the sides of the light emitting diodes distal from the first surface.

According to further preferred embodiment of the invention, the heat-resistant or fire-proof or non-inflammable material is arranged on the first surface in the form of a second surface. The second surface comprises a first and a second partial surface. Both partial surfaces comprise a plurality of recesses which are arranged in both partial surfaces of the second surface such that the light emitted by the light emitting diodes, at least in a direction of the surface normal, is not inhibited by the second surface from being irradiated. Objects are fixed, in each case, at the recesses in the partial surface distal from the first surface on the side of the first partial surface distal from the first surface and facing the first surface, the objects being being particularly glued to this partial surface, which objects are transparent or at least sufficiently transparent for the light emitted by the light emitting diodes and are made from the heat-resistant or fire-proof or non-inflammable material which preferably comprises glass platelets.

The term gluing, in this context, shall be understood to denote a method of manufacturing which belongs to the main group of joining methods. Like welding and soldering, gluing also belongs to the, in technical language so-called, cohesive connection joining methods of manufacturing technology. By gluing the parts to be joined are cohesively connected.

The glue adheres to the surfaces of the part to be joined by physical (and under certain circumstances also by chemical) interactions. This phenomenon is also called adhesion. Other than welding and soldering, gluing belongs to the joining methods where no heat needs to be present or added. With the gluing of plastic materials with organic glues diffusion processes take place between the glue and a part to be joined, which diffusion processes contribute to the adhesion. The lower inherent strength of the adhesive or glue as compared to the one of many materials of the parts to be joined (like, e.g., metals, glasses) can, in many cases, be compensated by gluing of large areas. This requires, if need be, a construction and design of the location to be glued adapted to the gluing.

In a technical view, gluing is a joining method with which nearly all materials can be bonded to and among each other. At the same time, the technology of gluing is particularly gentle because no large amounts of heat are necessary which could cause pulling out of shape, cooling stresses or structural changes of the parts to be joined. Also, for gluing, no weakening holes are necessary in the parts to be joined like, e.g., with screwing or riveting. Furthermore, the force is transmitted in the form of an area from one part to be joined to another. These properties of gluing are especially advantageous in the context of heat sensitive light emitting diodes (LEDS). Nevertheless, parts of the assembly according to the invention can also be fixed by screws of rivets.

The present invention allows, depending on the chosen embodiment, particularly the realization of the following advantageous effects:

The resistance of the entire assembly to fire is significantly improved by the construction according to the invention. Depending on the chosen embodiment, the present invention allows in particular and improved cooling of the light emitting diodes (LEDs) and of other components of the assembly. For this, a front panel made from a material with a good or very good thermal conductivity, preferably aluminum, is particularly well suited.

Further advantages and features of the invention will be described in the following with reference to the attached schematic drawings wherein show.

Figure 1:
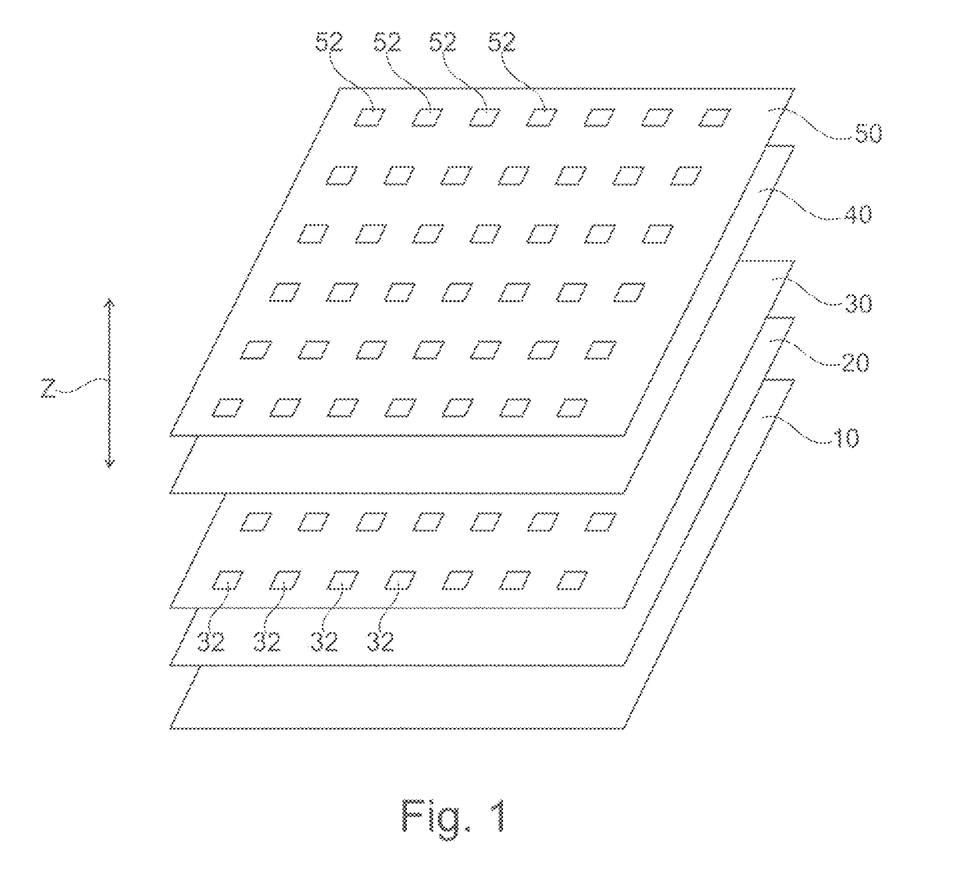
FIG. 1 schematic representation of an exploded view of an embodiment of an assembly according to the invention.

The schematic representation of an exploded view of an embodiment of an assembly according to the invention shown in FIG. 1 comprises in the direction of the z-axis (double arrow Z) shown in this figure, on top of each other, a backplane 10, an optional circuit board 20 with the electronic components, a circuit board 30 with light emitting diode chips 32 (LED), a transparent layer 40 and the front panel 50. The front panel 50 together with the transparent layer 40 corresponds (in the terminology of the claims) to an embodiment of the second surface, whereas the first surface 20, in embodiment, is realized by the circuit board 30.

Equal and equivalent components are generally denoted with the same reference numbers in the figures.

All surfaces shown as planes in FIG. 1 need not in all conceivable and advantageous embodiments necessarily be plane but can rather have a cylindrical, conical or spherical form or can be surfaces which are otherwise bent with a finite radius of curvature or finite radii of curvatures, respectively. Since the front panel 50 in this embodiment is assumed to be not (sufficiently) transparent for the light emitted by the light emitting diodes 32, the front panel 50 comprises recesses 52 which enable the radiation of the light emitted by the light emitting diodes 32 at least in the direction of a surface normal. Since the plane or curved surfaces 10, 20, 30, 40, and 50 are essentially parallel to each other, the surface normal (i.e. the direction perpendicular to the surface) is directed for all surfaces parallel to each other in each single point in the same direction. This is why it is justified to talk only of the direction of "the" surface normal even if in the case of curved parallel surfaces, which is not shown in the figures, the direction of the surface normal will point into different directions for two different, e.g. adjacent, points.

The optional circuit board 20 can, e.g., have components which are needed for the temporally and/or spatially selective controlling or driving of the light emitting diodes 32. Of course, all the features shown in FIG. 1 as well as all the features of the respective embodiments shown in the other figures are optional in the sense that the scope of the subject matter of the present invention is defined by the patent claims rather than the figures or other embodiments which serve only the purpose of explaining the patent claims.

Figure 2:
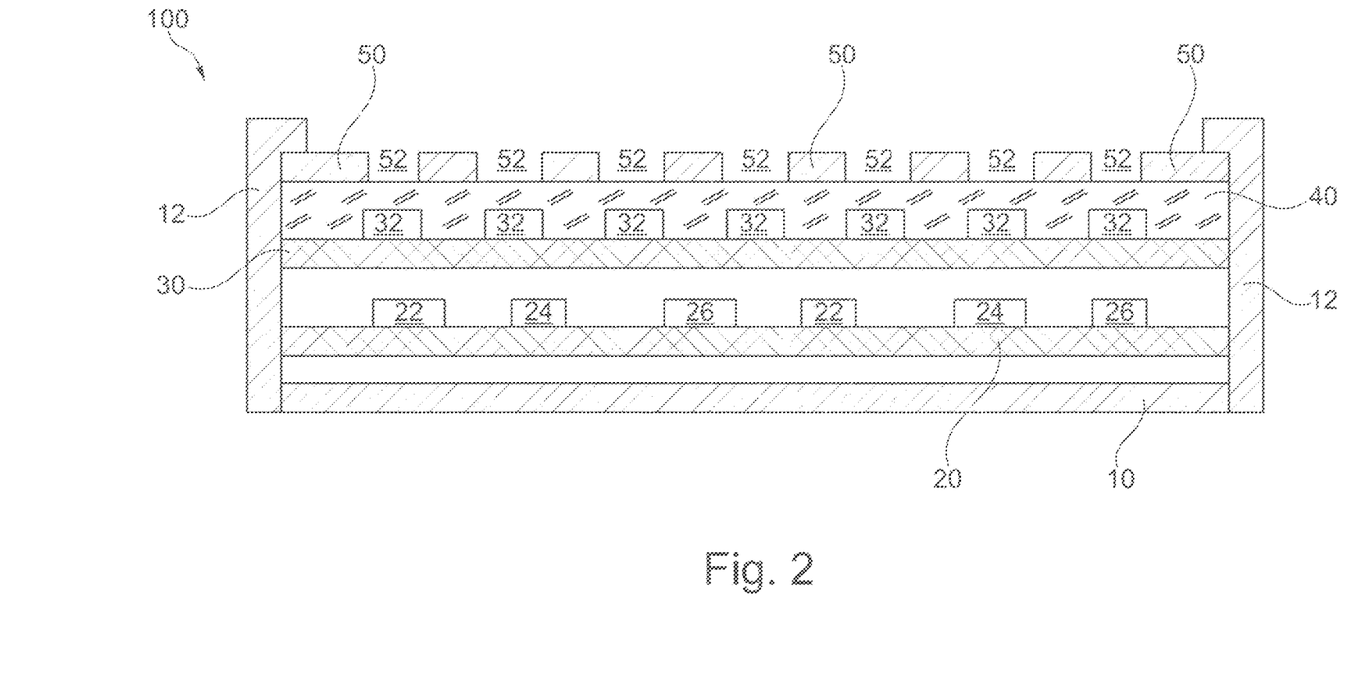
FIG. 2 a schematic representation of the cross-sectional view of an embodiment of an assembly according to the invention.

The schematic representation of the cross-sectional view of an embodiment of an assembly according to the invention which is shown in FIG. 2 shows, additionally to the elements depicted in FIG. 1, namely the backplane 10, the circuit board 30 with light emitting diode (LED) chips 32, the transparent layer 40 and the front-panel 50, the circuit board 20 having electronic components 22, 24, and 26 as well as sidewalls 12. In this embodiment, the interspaces between the LED-chips 32 are filled with a transparent material 40 in the entire region between the circuit board 30 and the front-panel 50.

In other embodiments, the transparent material 40 can, amongst other things or exclusively, fill up partially or completely the recesses 52 of the front-panel 50 or it can—e.g. as a, preferably thin, glass platelet—be arranged at the bottom of the front-panel 50, preferably in the region of the recesses 52, and preferably such that they close the recesses 52.

Figure 3:
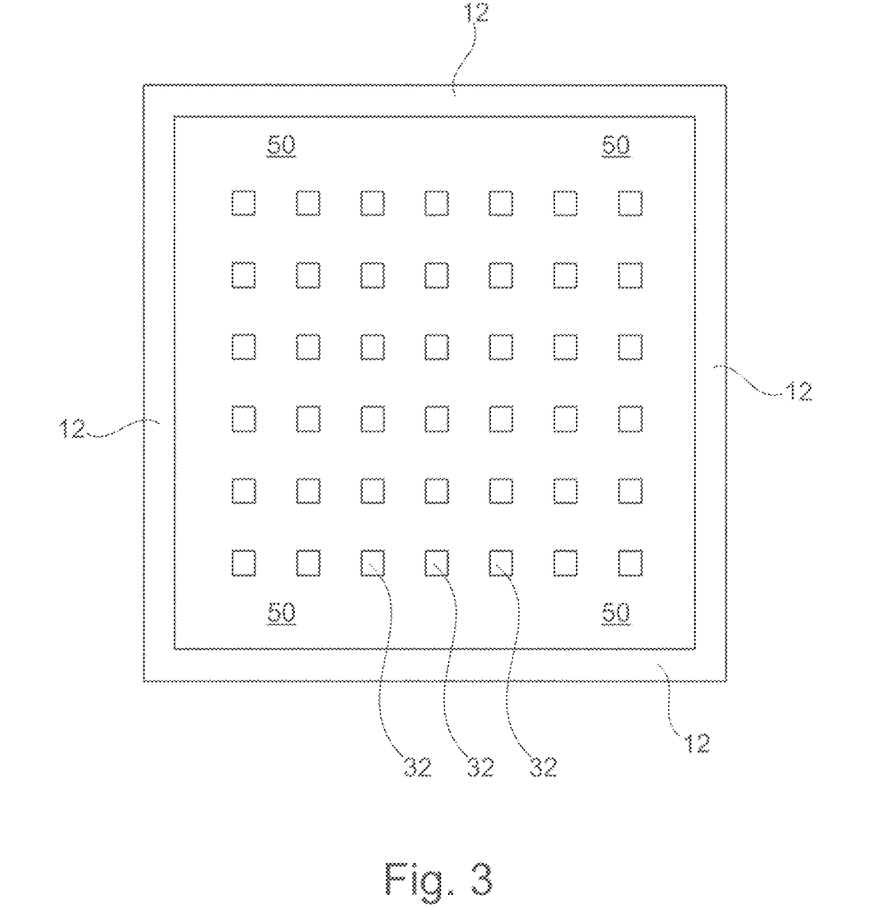
FIG. 3 a schematic representation of the top view of an embodiment of an assembly according to the invention.

The schematic representation of a top view of an embodiment of an assembly according to the invention shown in FIG. 3 shows. apart from the front-panel 50, the LED-chips 32 which are visible through recesses 52 formed in the front-panel 50. The assembly is held together by sidewalls 12.

Figure 4:
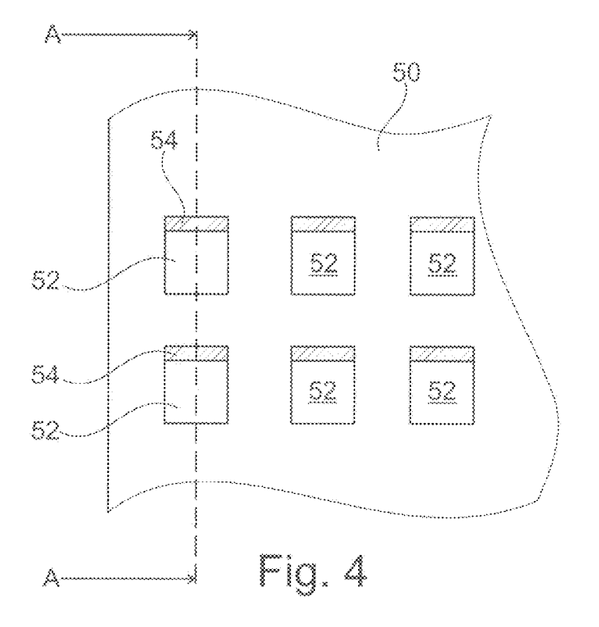
FIG. 4 a schematic representation of the detail of a further embodiment.

The schematic representation of a detail of a further embodiment of an assembly according to the invention shown in FIG. 4 shows the recesses 52 with protrusions 54 on the front-panel 50. The recesses 52 have a rectangular boundary which is delimited by four straight lines. At one of these four lines, the boundary of the recesses has, in each case, a protrusion 54 which can in particular serve the purpose of shading of light incident from above.

Figure 5:
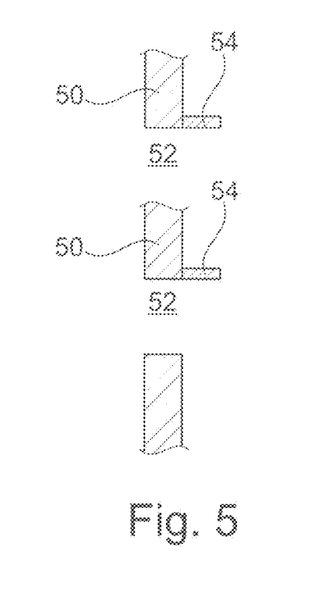
FIG. 5 across-sectional view along line A-A in FIG. 4.

The cross-sectional view along line A-A in FIG. 4 shown in FIG. 5 shows the protrusions 54 at the recesses 52 of the front-panel 50 from the side.

In addition to further embodiments realizations of the present invention are possible where the front-panel 50 comprises aluminum that envelopes the assembly, at least partially, like a capsule. The encapsulation serves preferably the purpose of protection against weather and protects the circuit boards and/or the components preferably from penetrating water. It can be lacquered and/or can comprise materials like glue or silicones.

In other embodiments a shader made of glass (glass-shader) is provided from which the front-panel is cast. The LEDs can comprise fiberglass elements or glass lenses. The backplane 10 can also receive a power supply.

The interspaces in the front layer of the assembly between the front-panel and the circuit board with the LEDs is preferably filled with a fire-retardant (A1) material, which preferably comprises a non-flammable and inorganic material, e.g. aluminum, glass, fiberglass and/or the like. The front layer can be lacquered, anodized or powder-coated. For electrical reasons, it can be electrically grounded.

The front layer can also be termed as a front-panel. The front layer can, particularly in the case where the interspaces between the light emitting diodes are not filled, comprise a material which is transparent for the light of the light emitting diodes and which is furthermore heat-resistant, fire-retardant and/or non-flammable and can in particular be made from this material.

In some embodiments of the present invention, only the interspaces between the LEDs are filled with the A1-material. The LEDs or SMDs (Surface Mounted Devices) so to speak shine through the A1-material. In other embodiments of the present invention, glass platelets are, preferably additionally, fixed on the LEDs or SMDs and are preferably glued to the latter.

Alternatively, the glass platelets can, instead of being glued to the LEDs are SMDs, also be glued to a front partial panel of two partial panels of which the front panel can consist in this embodiment. One of the partial panels or both partial panels preferably comprise aluminum. The front partial panel is preferably screwed to the second partial panel lying behind it. The interspaces between the LEDs or the SMDs are filled preferably with an A1-material which is preferably optically transparent.

The LED-circuit board 30 can be a single-layer or multilayer circuit board. It can have flammable or non-flammable, preferably A1-materials. It can have in particular electronic components like dimming-ICs, resistors or other components. It can comprise so-called connectors and/or connection panels and, on the side facing the front panel, preferably comprises only LEDs and/or SMDs with a characteristics of radiation which can be influenced by the front layer and in particular by the front panel.

The electronics circuit board 20 carries, if present, preferably electronic components, preferably a CPU, driver chips, resistors, a power supply or the like, for controlling the electronic components on the LED-circuit board, preferably for controlling the LEDs. Between the electronics-circuit board 20 and the backplane 10, the so-called back layer, components of a power supply, connectors or connection panels can in particular be provided.

The back layer encapsulates the components of the assembly to the back preferably made of non-flammable A1-material. The back layer can have recesses for electrical data lines and/or power supply lines or ports.

The sidewalls 12, preferably made from a non-flammable A1-material, encapsulate the entire setup, i.e. the assembly 100, in the side direction and preferably so leakproof that the surface is fire-retardant.

Some or all components of the assembly, in particular the housing of the LEDs, are made preferably from an inorganic material and/or a non-flammable material or comprise such a material. Preferably it is an A1 material or a combination of materials which comprise A1 materials, in particular fiberglass and/or glass lenses.

The front layer of the assembly can preferably be a cast front layer made of glass. The LEDs or SMDs can have a glass cap or a glass lens. The glass used for this is preferably a fire-retardant class such that the cast front panel realizes an effective protection against fire.

The cast front panel 40 made of glass or another optically transparent fire-retardant material could preferably have, on its internal side the spatial structure of a negative to the spatial structure of the upper side of the LED circuit board 30 which is directly below it, such that by a fit joining of both panels a solid panel without interspaces is achieved because the interspaces of the LED-circuit board are filled by the corresponding structures of the front-panel. The front wall 50 could be dropped with such embodiments.

REFERENCE NUMBERS 100 assembly
10 backplane
12 sidewalls
20 circuit board with electronics (optional)
22, 24, 26 electronic components
30 circuit board with LED-chips
32 LED-chips
40 transparent layer, e.g. lacquer
50 front wall
52 recesses in front wall
54 protrusion for shading of light incident from above, particularly sunlight

The invention claimed is:

1. An assembly comprising:
a housing including a back layer and sidewalls that form back and side external surfaces of an interior of the assembly, wherein the back layer and sidewalls are formed of a non-flammable A1-material,
a plurality of light emitting diodes which are arranged within the interior of the assembly, the plurality of light emitting diodes spaced from each other and the sidewalls by interspaces,
an interspace layer, wherein the interspace layer comprises a first heat-resistant or fire-proof or non-flammable material, and
a front panel, distinct from the interspace layer, located entirely in front of the plurality of light emitting diodes and the interspace layer and forming at least a portion of another external surface of the assembly, wherein the front panel comprises a second heat-resistant or fire-proof or non-flammable material,
wherein the interspace layer completely fills the interspaces between the plurality of light emitting diodes and between the plurality of light emitting diodes and the sidewalls,
wherein the interior directly below the front panel is completely filled by the interspace layer such that the interspace layer contacts an internal surface of the front panel,
wherein the front panel is not transparent or not sufficiently transparent for the light emitted by the light emitting diodes, and comprises a plurality of recesses which are arranged such that the front panel does not inhibit the light emitted by the light emitting diodes, at least in a direction of a surface normal, from being irradiated through the front panel, and
wherein the front panel, the interspace layer, and the housing encapsulate and provide fire protection for the plurality of light emitting diodes.

2. The assembly according to claim 1, wherein at least one of: the interspace layer or the front panel, comprises an inorganic, ceramic, glass, or metallic material.

3. The assembly according to claim 1, wherein the light emitting diodes are arranged on a first surface in a matrix form.

4. The assembly according to claim 1, wherein the recesses are filled with a heat-resistant or fire-proof or non-inflammable material which is transparent or at least sufficiently transparent for the light emitted by the light emitting diodes.

5. The assembly according to claim 1, wherein the first heat-resistant or fire-proof or non-flammable material is at least partially transparent for the light of the light emitting diodes.

6. The assembly according to claim 1, wherein the interspace layer and the front panel comprise first and second partial surfaces, the plurality of recesses are arranged in both partial surfaces such that the interspace layer and the front panel do not inhibit the light emitted by the light emitting diodes, at least in the direction of the surface normal, wherein transparent or at least sufficiently transparent objects for the light emitted by the light emitting diodes and made from a heat-resistant or fire-proof or non-inflammable material are arranged on the partial surfaces.

7. The assembly according to claim 1, wherein the front panel further comprises protrusions extending from the another external surface of the assembly in the direction of the surface normal to the front panel at a boundary of each of the recesses.

8. The assembly according to claim 7, wherein the protrusions are located only in a partial region of the boundary of each of the recesses.

9. A video board comprising:
at least one assembly comprising a housing, wherein the housing includes a back layer and sidewalls that form an interior of the assembly, wherein the back layer and sidewalls are formed of a non-flammable A1-material,
a plurality of light emitting diodes which are arranged within the interior of the assembly spaced from each other and the sidewalls by interspaces,
an interspace layer, wherein the interspace layer comprises a first heat-resistant or fire-proof or non-flammable material,
a front panel, distinct from the interspace layer, located entirely in front of the plurality of light emitting diodes and the interspace layer and forming at least a portion of an external surface of the assembly, wherein the front panel comprises a second heat-resistant or fire-proof or non-flammable material,
wherein the interspace layer completely fills the interspaces between the plurality of light emitting diodes and between the plurality of light emitting diodes and the sidewalls,
wherein the interior directly below the front panel is completely filled by the interspace layer such that the interspace layer contacts an internal surface of the front panel,
wherein the front panel is not transparent or not sufficiently transparent for the light emitted by the light emitting diodes, and comprises a plurality of recesses which are arranged such that the front panel does not inhibit the light emitted by the light emitting diodes, at least in a direction of a surface normal, from being irradiated through the front panel, and
wherein the front panel, the interspace layer, and the housing encapsulate and provide fire protection for the plurality of light emitting diodes.

10. The video board according to claim 9, wherein at least one of: the interspace layer or the front panel, comprises an inorganic, ceramic, glass, or metallic material.

11. The video board according to claim 9, wherein the light emitting diodes are arranged on a first surface in a matrix form.

12. The video board according to claim 9, wherein the recesses are filled with a heat-resistant or fire-proof or non-inflammable material which is transparent or at least sufficiently transparent for the light emitted by the light emitting diodes.

13. The video board according to claim 9, wherein the first heat-resistant or fire-proof or non-flammable material is at least partially transparent for the light of the light emitting diodes.

14. The video board according to claim 9, wherein the interspace layer and the front panel comprise first and second partial surfaces, the plurality of recesses are arranged in both partial surfaces such that the interspace layer and the front panel do not inhibit the light emitted by the light emitting diodes, at least in the direction of the surface normal, wherein transparent or at least sufficiently transparent objects for the light emitted by the light emitting diodes and made from a heat-resistant or fire-proof or non-inflammable material are arranged on the partial surfaces.

15. The video board according to claim 9, wherein the front panel further comprises protrusions extending from the external surface of the assembly in the direction of the surface normal to the front panel at a boundary of each of the recesses.

16. The video board according to claim 15, wherein the protrusions are located only in a partial region of the boundary of each of the recesses.

17. The video board according to claim 9, further comprising a control device for controlling of the at least one assembly.

18. The video board according to claim 9, further comprising energy supply means for supplying of the at least one assembly.

19. An assembly comprising:
- a housing including a back layer and sidewalls that form back and side external surfaces of an interior of the assembly, wherein the back layer and sidewalls are formed of a non-flammable A1-material,
- a plurality of light emitting diodes arranged on a first interior surface of the interior of the assembly, the plurality of light emitting diodes spaced from each other and the sidewalls by interspaces;
- an interspace layer, wherein the interspace layer comprises a first heat-resistant or fire-proof or non-flammable material;
- a front panel, distinct from the interspace layer, located entirely in front of the plurality of light emitting diodes and the interspace layer, wherein the front panel comprises a second heat-resistant or fire-proof or non-flammable material,
- wherein the interspace layer completely fills the interspaces between the plurality of light emitting diodes and between the plurality of light emitting diodes and the sidewalls,
- wherein the interior directly below the front panel is completely filled by the interspace layer such that the interspace layer contacts an internal surface of the front panel, and
- wherein the first heat-resistant or fire-proof or non-flammable material is optically transparent and is located over the plurality of light emitting diodes,
- wherein the second heat-resistant or fire-proof or non-flammable material is not transparent or not sufficiently transparent for the light emitted by the light emitting diodes, and comprises a plurality of recesses which are arranged such that the second heat-resistant or fire-proof or non-flammable material does not inhibit the light emitted by the light emitting diodes, at least in a direction of a surface normal, from being irradiated through the front panel, and
- wherein the front panel, the interspace layer, and the housing encapsulate and provide fire protection for the plurality of light emitting diodes.

20. The assembly according to claim 19, wherein at least one of: the interspace layer or the front panel, comprises an inorganic, ceramic, glass, or metallic material.

21. The assembly according to claim 19, wherein the light emitting diodes are arranged on a first surface in a matrix form.

* * * * *